(12) United States Patent
Kwak

(10) Patent No.: US 7,362,634 B2
(45) Date of Patent: Apr. 22, 2008

(54) BUILT-IN SYSTEM AND METHOD FOR TESTING INTEGRATED CIRCUIT TIMING PARAMETERS

(75) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/442,506

(22) Filed: May 25, 2006

(65) Prior Publication Data

US 2007/0280032 A1    Dec. 6, 2007

(51) Int. Cl.
*G11C 7/00* (2006.01)

(52) U.S. Cl. ...................... 365/201; 365/200

(58) Field of Classification Search ............ 365/201

See application file for complete search history.

(56) References Cited

U.S. PATENT DOCUMENTS

2005/0162948 A1*   7/2005   Swanson et al. ............ 365/201

* cited by examiner

*Primary Examiner*—Amir Zarabian
*Assistant Examiner*—Jason Lappas
(74) *Attorney, Agent, or Firm*—Dorsey & Whitney LLP

(57) ABSTRACT

A built-in self-test system for a dynamic random access memory device using a data output register of the memory device to apply test signals to data bus terminals and a data strobe terminal of the memory device responsive to respective clock signals. The clock signal are generated by a test system oscillator and coupled through a clock tree of the memory device. The test system further includes a selector that sequentially selects each of the test signals applied to the data bus terminals and applies the selected test signal to a multi-phase generator. The multi-phase generator delays the selected signal by different time to generate a set of delayed signals. The phases of the delayed signals are compared to the test signal applied to the data strobe terminal to determine the delay of the compared signals relative to each other, thereby determining the timing parameter.

21 Claims, 5 Drawing Sheets

BUILT-IN SYSTEM AND METHOD FOR TESTING INTEGRATED CIRCUIT TIMING PARAMETERS

TECHNICAL FIELD

This invention relates to integrated circuit devices such as memory devices, and, more particularly, to a method and system included in an integrated circuit for testing timing parameters in the integrated circuit device.

BACKGROUND OF THE INVENTION

During the fabrication of integrated circuits such as memory devices, it is conventional to test such integrated circuits at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board that are connected to the integrated circuits. The test head is connected through a cable to a high-speed tester so that the tester can apply signals to and receive signals from the integrated circuits.

One type of tests typically performed on integrated circuits such as memory devices are tests of the timing margins of the integrated circuits. For example, one memory device timing parameter that is normally tested is the skew of a data strobe signals DQS with respect to last read data signal DQ to become valid, which is abbreviated as $t_{DQSQ}$. Another memory device timing parameter that is normally tested is the DQ-DQS hold time, abbreviated as $t_{QH}$, which is the skew of the DQS signal with respect to the first DQ signal to become invalid. In synchronous memory devices, read data signals DQ are output from the memory devices in synchronism with a data strobe signal DQS. With reference to FIG. 1, the data strobe signal DQS transitions active at time $t_0$, and the read data signals DQ then become valid. The maximum time needed for the last of the read data signals DQ to become valid after the transition of DQS at $t_0$, i.e., $t_{DQSQ}$, is normally specified for a memory device. The timing parameter $t_{DQSQ}$ thus represents the maximum acceptable skew between the last of the read data signals DQ that becomes valid and the data strobe signal DQS. Similarly, the minimum time that the earliest of the read data signals DQ becomes invalid after the transition of DQS at $t_0$, i.e., $t_{QH}$, is also normally specified for a memory device.

The time between $t_{DQSQ}$ and $t_{QH}$ is the data valid period. The length of the data valid period may be excessively reduced by any increase in the DQS-DQ skew beyond the specified maximum $t_{DQSQ}$ or any decrease of the DQ-DQS hold time from the specified $t_{QH}$. As the length of the data hold period gets smaller, it becomes more difficult for the memory device to position transitions of the DQS signal at the start of the data valid period. It is therefore important to determine the data set-up and data hold times of a memory device being tested to ensure that a sufficient data valid period can be achieved.

The above-described testing environment works well in many applications to test the timing parameters of integrated circuits such as memory devices. However, the testing environment is not without its limitations and disadvantages. For example, it is very difficult to test various timing characteristics of the integrated circuits, particularly at the high operating speeds for which such integrated circuits are designed. This difficulty in testing timing characteristics results primarily from the propagation delays in the cable coupling the tester to the test head. The cables that are typically used in such testing environments are often fairly long, thus making the delays of signals coupled to and from the integrated circuits correspondingly long and often difficult to predict.

Another problem with the above-described testing environment is that it may not accurately simulate the conditions in which the integrated circuits will actually be used. In particular, the integrated circuits, and particularly the timing parameters of integrated circuits, are not generally tested during use in an actual operating environment and after a substantial period has lapsed. Therefore, even if the timing parameters of the integrated circuit were within specification when the integrated circuit was shipped from a fabrication facility, there can be no assurance that the timing parameters are within a specified range during use, particularly after a substantial period of time. Also, it is difficult to measure a skew between two output ports as opposed to measuring a skew between an input port and an output port.

There is therefore a need for a testing system and method that can be easily fabricated in an integrated circuit to allow the timing parameters of an integrated circuit to be accurately tested during actual use of the integrated circuit.

SUMMARY OF THE INVENTION

A test system and method for determining the relative timing between first and second digital signals includes a multi-phase signal generator that delays the first digital signal by different delay times to generate a plurality of delayed signals. The delayed signals are received by respective phase detectors each of which also receive the second digital signal. Each of the phase detectors generates an output signal having a logic level corresponding to the logic level of one of the received signals at a predetermined transition of the other of the received signals. The output signals are examined to determine the approximate timing of the first digital signal relative to the second digital signal. The test system and method can be used in a memory device to determine a timing parameter by determining the relative timing of signals applied to data bus terminals and a data strobe terminal responsive to respective clock signals coupled through a clock tree of the memory device.

DETAILED DESCRIPTION

Figure 1:
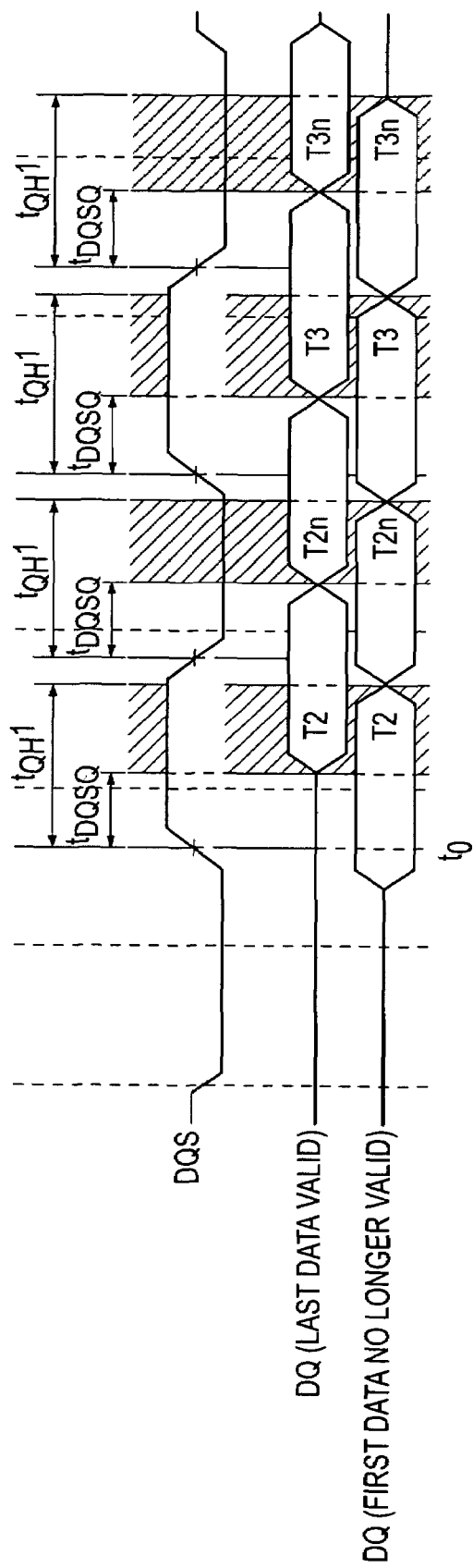
FIG. 1 is a timing diagram showing a specific relationship between a data signal and a data strobe signal corresponding to a conventional memory device timing parameter.
Figure 2:
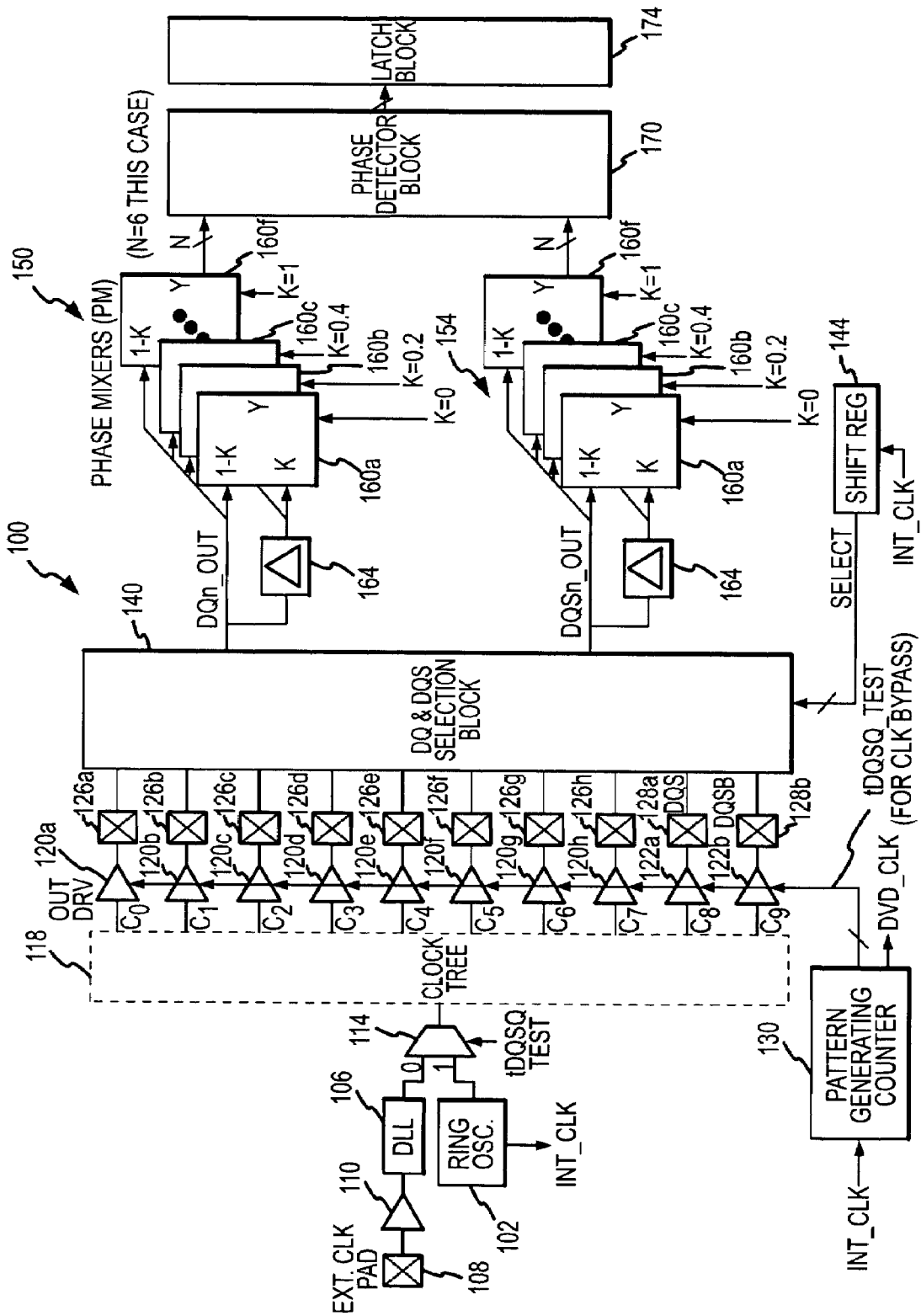
FIG. 2 is a block diagram of a memory device testing system for determining a timing parameter of a memory device.

A built-in self-test system 100 according to one example of the invention is shown in FIG. 2. The self-test system 100 is preferably fabricated on the same substrate as a memory device (not shown) being tested, although other configurations may also be used. The system 100 includes a ring oscillator 102 that generates a periodic clock signal that is used during testing. During normal operation, a clock signal is generated by a delay-lock loop 106 responsive to an external clock signal applied to an external terminal pad 108 and coupled through a driver 110. The advantage of using an internal oscillator is that it may be possible to make the frequency of the clock signal higher than the frequency of an externally applied clock signal. A multiplexer 114 responds to a $t_{DQSQ}$ test signal to select as an output clock signal the output of the delay-lock loop 106 during normal operation and the output of the ring oscillator 102 during memory device testing. The ring oscillator 102 also outputs an internal clock int_clk signal, which is used by other circuitry in the memory device being tested.

The clock signal from the multiplexer 114 is coupled through a clock tree 118, which distributes the clock signal to a plurality of signal drivers 120a-h and 122a,b. In the example shown in FIG. 2, the drivers 120a-h are provided to output one byte of data, and the drivers 122a,b are provided to output complementary data strobe signals DQS and DQSB. The logic levels of the signals output by the drivers 120, 122 are provided by a pattern generating counter 130, which is clocked by the int_clk signal. The drivers 120, 122 output respective logic levels to respective externally accessible data terminals 126a-h and data strobe terminals 128a,b, respectively, responsive to the received clock signals. Therefore, the drivers 120a-h apply incrementing patterns of data to the respective data terminals 126a-h in phase with the DQS and DQS terminals applied to the terminals 128. The signals applied to the terminals 126 by the drivers 120 during testing mimic read data signals that the drivers 120a-h apply to the terminals 126 during normal operation. Similarly, the signals applied to the terminals 128 by the drivers 122 during testing mimic data strobe signals that the drivers 122 apply to the terminals 128 during normal operation. However, in both normal operation and during testing, the drivers 120, 122 output signal responsive to clock signals coupled through the same clock tree 118.

The data and data strobe signals applied to the terminals 126, 128, respectively, are coupled to a DQ and DQS selector 140. The selector 140 selects one of the data signals applied to the data terminals 126a-h and one of the data strobe signals applied to the DQS terminals 128a,b responsive to a select signal, which is generated by a shift register 144. The shift register 144 sequentially selects the data signals from each of the data terminals 126a-h and the data strobe signal from one of the DQS terminals 128 responsive to the int_clk signal.

The data signal selected by the selector 140 is applied to a first multi-phase signal generator circuit 150, and the data strobe selected by the selector 140 is applied to a second multi-phase signal generator circuit 154. In the example shown in FIG. 2, each of the multi-phase signal generator circuits 150, 154 includes six phase mixers 160a-f, which receive the selected data or data strobe signal and a delayed version of such signal through a delay unit 164. The phase mixers 160a-f generate respective delayed signals on a 6-bit bus. The delay of the delayed signals vary between substantially zero delay and the delay provided by the delay unit 164. If the delay unit 164 delays the received signal by $t_D$, the delayed signals from the respective phase mixers 160a-f will have respective delays of 0, $0.2t_D$, $0.2t_D$, $0.4t_D$, $0.8t_D$ and $t_D$.

The six delayed signals from the first multi-phase signal generator circuit 150 and the six delayed signals from the second multi-phase signal generator circuit 154 are applied to phase detectors 170. The phase detectors 170 compare the timing of transitions of each of the delayed data signals from the first multi-phase signal generator circuit 150 with corresponding transitions of the zero delay output from the phase mixer 160a in the second multi-phase signal generator circuit 154. The phase detectors 170 also compare the timing of transitions of each of the delayed data strobe signals from the second multi-phase signal generator circuit 154 with corresponding transitions of the zero delay output from the phase mixer 160a in the first multi-phase signal generator circuit 150. Based on these comparisons, the timing of the data signal selected by the selector 140 relative to the timing of the data strobe signal selected by the selector 140 can be determined.

Figure 3:
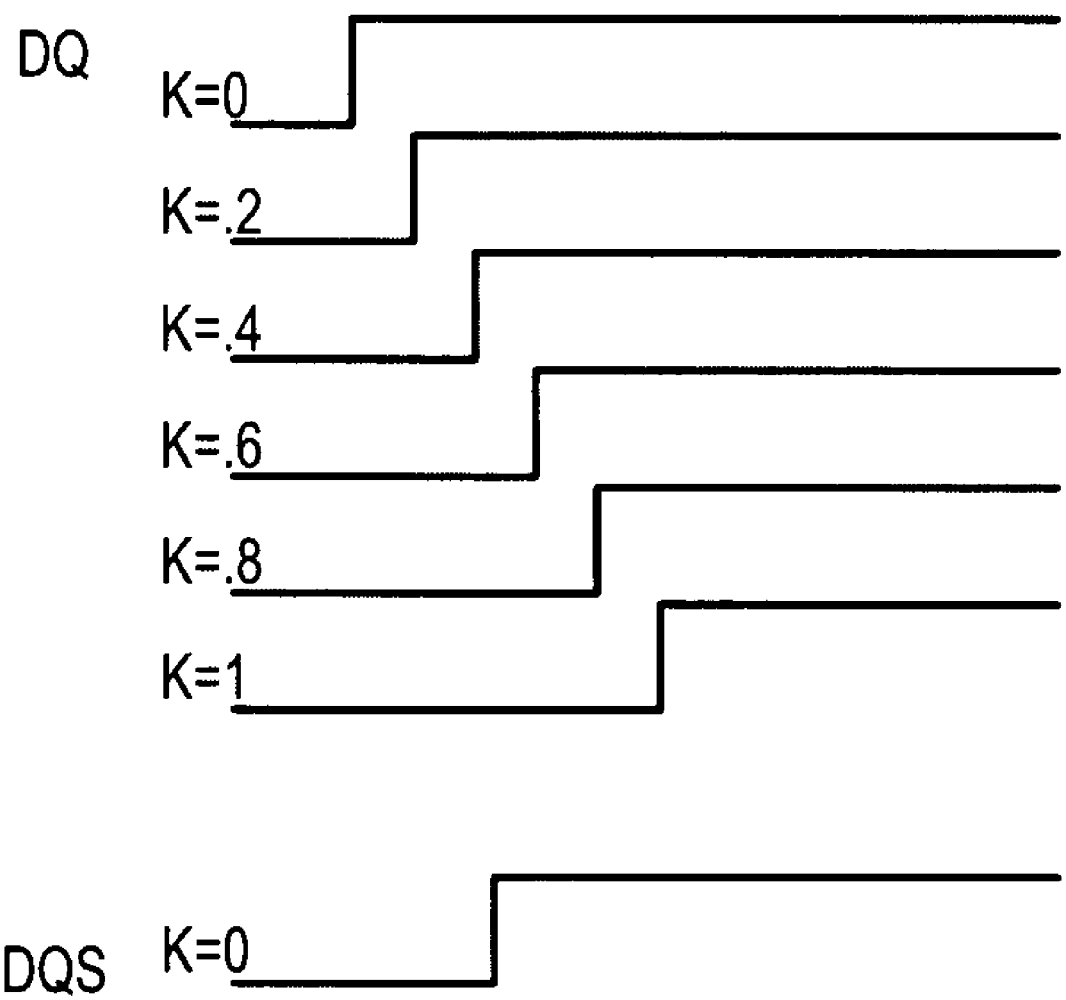
FIG. 3 is a timing diagram showing timing relationships between a data strobe signal and several different phases of a data signal.

The manner in which the signal generator circuits 150, 154 and the phase detectors 170 can determine the timing of the data signal relative to the timing of the data strobe signal will now be explained with respect to the signals shown in FIG. 3. The first six signals shown in FIG. 3 are the data signals DQ output from each of the phase mixers 160a-f with delays corresponding to the respective K values. The final signal shown in FIG. 3 is the data strobe signal DQS selected by the selector 140, which is generated by the phase mixer 160a in the second multi-phase signal generator circuit 154. As explained in greater detail below, the phase detectors 170 used in the system 100 of FIG. 2 may output a logic level corresponding to the logic level of the DQS signal at the rising edge of each of the DQ signals. Therefore, the phase detectors 170 for the K=0, K=0.2 and K=0.4 phases of the DQ signal will output a "0," and the phase detectors 170 for the K=0.6, K=0.8 and K=1 phases of the DQ signal will output a "1." The bits from all of the phase detectors 170 are thus "000111." These bits can be used to determine the time that the data signal DQ leads the data strobe signal DQS according to the following table:

TABLE 1

| BIT PATTERN | DQ Leads DQS By |
|---|---|
| 0 0 0 0 0 0 | >$t_D$ |
| 0 0 0 0 0 1 | $0.8t_D$-$t_D$ |
| 0 0 0 0 1 1 | $0.6t_D$-$0.8t_D$ |
| 0 0 0 1 1 1 | $0.4t_D$-$0.6t_D$ |
| 0 0 1 1 1 1 | $0.2t_D$-$0.4t_D$ |
| 0 1 1 1 1 1 | 0-$0.2t_D$ |
| 1 1 1 1 1 1 | DQS Leads DQ |

A similar table obtained from the phase detectors 170 corresponding to the logic level of the DQ signal at the rising edge of each of the DQS signals from the phase mixer 160a-f in the second multi-phase signal generator 154 provides an indication of the degree to which the DQ signal lags the DQS signal. In this case, the DQ signal is generated by the phase mixer 160a in the first multi-phase signal generator 150 for K=0.

The bit patterns corresponding to these comparisons are applied to latches 174, which latch the bit patterns. Signals corresponding to the latched bit patterns are then output from the self-test system 100. These signals from the latches 174 may be output from the memory device containing the self-test system 100 so that an external device can determine the value of the timing parameter $t_{DQSQ}$.

In operation, all possible patterns of signals corresponding to respective counts of the pattern generating counter are applied to the data and data strobe terminals responsive to the clock signal from the ring oscillator. As each pattern is applied to the data and data strobe terminals, a first of the data terminals and one of the data strobe terminals are coupled to the first and second multi-phase signal generator circuits 150, 154, respectively, by the selector. The signals from the signal generator circuits 150, 154 are compared as described below, and the resulting comparison signals latched. More specifically, the relative timing between the rising edge of the selected data signal and the rising and falling edges of the DQS signal is first determined. Next, the relative timing between the falling edge of the selected data signal and the rising and falling edges of the DQS signal is determined. The same process is repeated with the selector 140 coupling the other data strobe signal DQSB to the signal generator 154 so that the system 100 can determine the timing of the rising edge of the selected data signal relative to the rising and falling edges of the DQSB signal. Finally, the timing of the falling edge of the selected data signal is compared in the same manner to the rising and falling edges of the DQSB signal. Based on these signals, the worst-case propagation delay through the drivers 120a, 122a and clock tree 140 can be determined for the patterns of data signals.

The selector 140 subsequently couples each of the remaining data terminals 126 and the DQS terminals 128 to the signal generator circuits 150, 154 to determine the timing parameter $t_{DQSQ}$ for all of the data terminals. The worst case value for $t_{DQSQ}$ can be determined and specified as the $t_{DQSQ}$ parameter for the memory device.

Although the bit pattern from the latches 174 may be output from a memory device after each test, the latches 174 are preferably all reset to "1" prior to starting a test and are not reset until after the test has been completed. During the test, an increasing number of latches 174 are set to "0" depending upon the degree to which each data signal being tested lags or leads the data strobe signal being tested. After the completion of a test, the number of latches 174 that have been set to "0" will correspond to the worst case skew of the data signals relative to the data strobe signals. The bit pattern 174 can then be output from the memory device at the conclusion of the test, and it will correspond to the timing parameter $t_{DQSQ}$.

Figure 4:
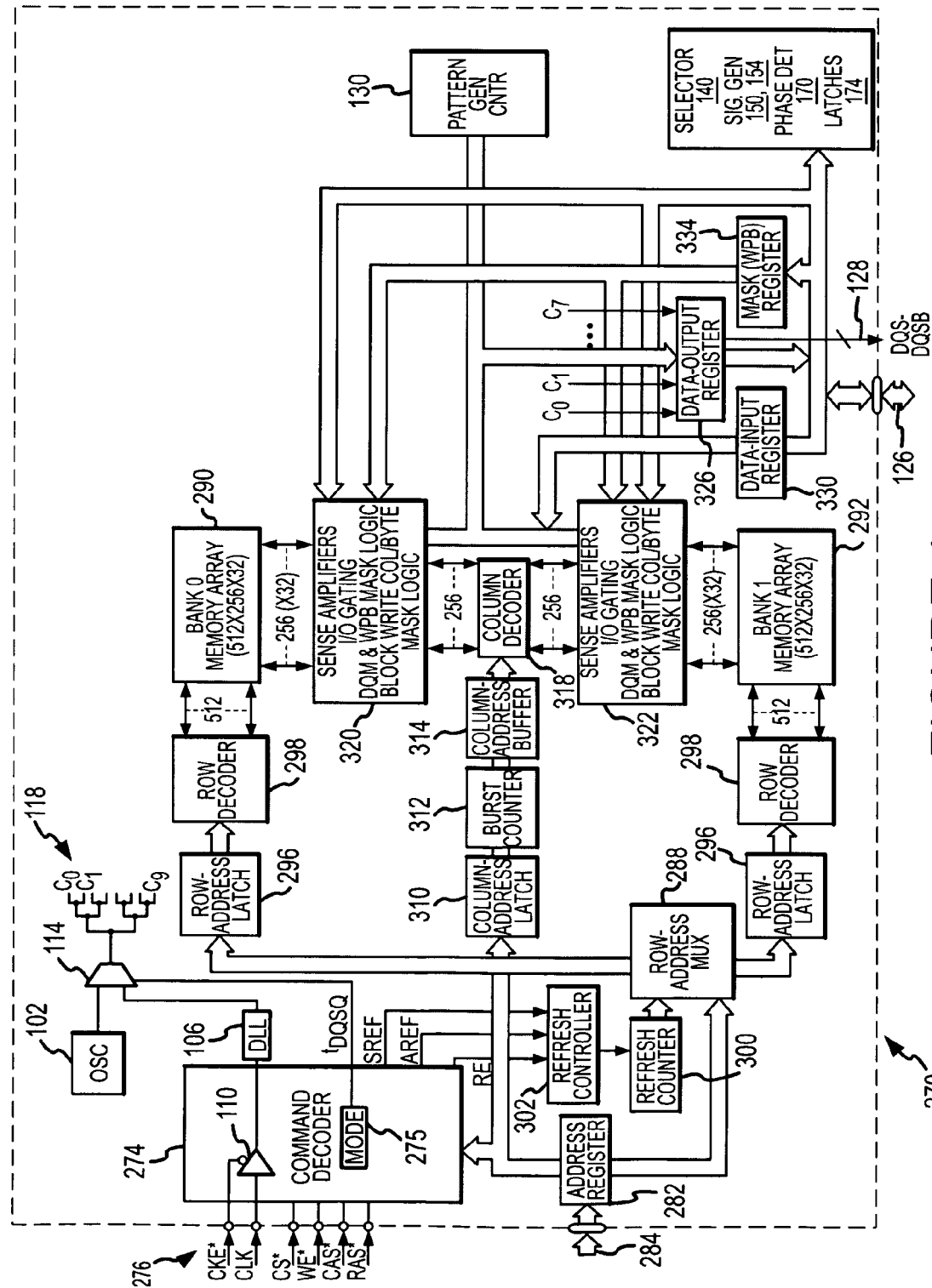
FIG. 4 is a block diagram of one example of a memory device using a timing parameter testing system according to one example of the invention.

FIG. 4 is a block diagram of a conventional synchronous dynamic random access memory ("SDRAM") 270 that uses a built-in self test system according to one example of the invention. However, it will be understood that test systems according to various examples of the invention can also be used in other types of DRAMs as well as in other types of memory devices. The operation of the SDRAM 270 is controlled by a command decoder 274 responsive to high level command signals received on a control bus 276. These high level command signals, which are typically generated by a memory controller (not shown in FIG. 4), are a clock enable signal CKE*, a clock signal CLK, a chip select signal CS*, a write enable signal WE*, a row address strobe signal RAS*, and a column address strobe signal CAS*, in which the "*" designates the signal as active low. The command decoder 274 includes the driver 110 receiving the external clock signal CLK, which is selectively enabled by the clock enable signal CKE*. As explained above, the output of the driver 110 is applied to a delay lock loop 106, which output a clock signal to the multiplexer 114. As also explained above, the multiplexer 114 also receives the clock signal from the ring oscillator 102, and it is controlled by the $t_{DQSQ}$ test signal. In the SDRAM 270 shown in FIG. 4, the $t_{DQSQ}$ test signal is generated by a mode register 275 included in the command decoder 274. Regardless of whether the DLL 106 or the oscillator 102 generates the clock signal, the clock signal is distributed through the clock tree 118 as clock signals $C_0, C_1 \ldots C_9$ to circuitry that will be described below.

The command decoder 274 also generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

The SDRAM 270 includes an address register 282 that receives either a row address or a column address on an address bus 284. The address bus 284 is generally coupled to a memory controller (not shown in FIG. 9). Typically, a row address is initially received by the address register 282 and applied to a row address multiplexer 288. The row address multiplexer 288 couples the row address to a number of components associated with either of two memory arrays 290, 292 depending upon the state of a bank address bit forming part of the row address. Associated with each of the memory arrays 290, 292 is a respective row address latch 296, which stores the row address, and a row decoder 298, which decodes the row address and applies corresponding signals to one of the arrays 290 or 292.

The row address multiplexer 288 also couples row addresses to the row address latches 296 for the purpose of refreshing the memory cells in the arrays 290, 292. The row addresses are generated for refresh purposes by a refresh counter 300, which is controlled by a refresh controller 302. The refresh controller 302 is, in turn, controlled by the command decoder 274.

After the row address has been applied to the address register 282 and stored in one of the row address latches 296, a column address is applied to the address register 282. The address register 282 couples the column address to a column address latch 310. Depending on the operating mode of the SDRAM 270, the column address is either coupled through a burst counter 312 to a column address buffer 314, or to the burst counter 312 which applies a sequence of column addresses to the column address buffer 314 starting at the column address output by the address register 282. In either case, the column address buffer 314 applies a column address to a column decoder 318, which applies various column signals to corresponding sense amplifiers and associated column circuitry 320, 322 for one of the respective arrays 290, 292.

Data to be read from one of the arrays 290, 292 is coupled to the column circuitry 320, 322 for one of the arrays 290, 292, respectively. The data is then coupled to a data output register 326. The data output register 326 couples the read data to the data bus terminals 126 responsive to the clock signals $C_0, C_1 \ldots C_7$ that are coupled through the clock tree 118. In the $t_{DQSQ}$ test mode, the data signals are coupled to the data output register 326 from the pattern generating counter 130, and they are applied to the data bus terminals 126 responsive to the clock signals $C_0, C_1 \ldots C_7$ that are coupled through the clock tree 118. In a similar manner, the data output register 326 applies complementary data strobe signals DQS and DQSB to the data strobe terminals 128 responsive to the clock signals $C_8, C_9$.

Data to be written to one of the arrays 290, 292 are coupled from the data bus terminals 126 through a data input register 330 to the column circuitry 320, 322 where it is transferred to one of the arrays 290, 292, respectively. A mask register 334 may be used to selectively alter the flow of data into and out of the column circuitry 320, 322, such as by selectively masking data to be read from the arrays 290, 292.

During the $t_{DQSQ}$ test mode, the data signals applied to the data bus terminals 126 and the data strobe signals applied to the data strobe terminals 128 are applied to the selector 140, as previously explained. At the conclusion of the $t_{DQSQ}$ test, the latches 174 apply the test results to the data bus terminals 126 so an external device can determine the value of the timing parameter $t_{DQSQ}$ for the SDRAM 270.

Figure 5:
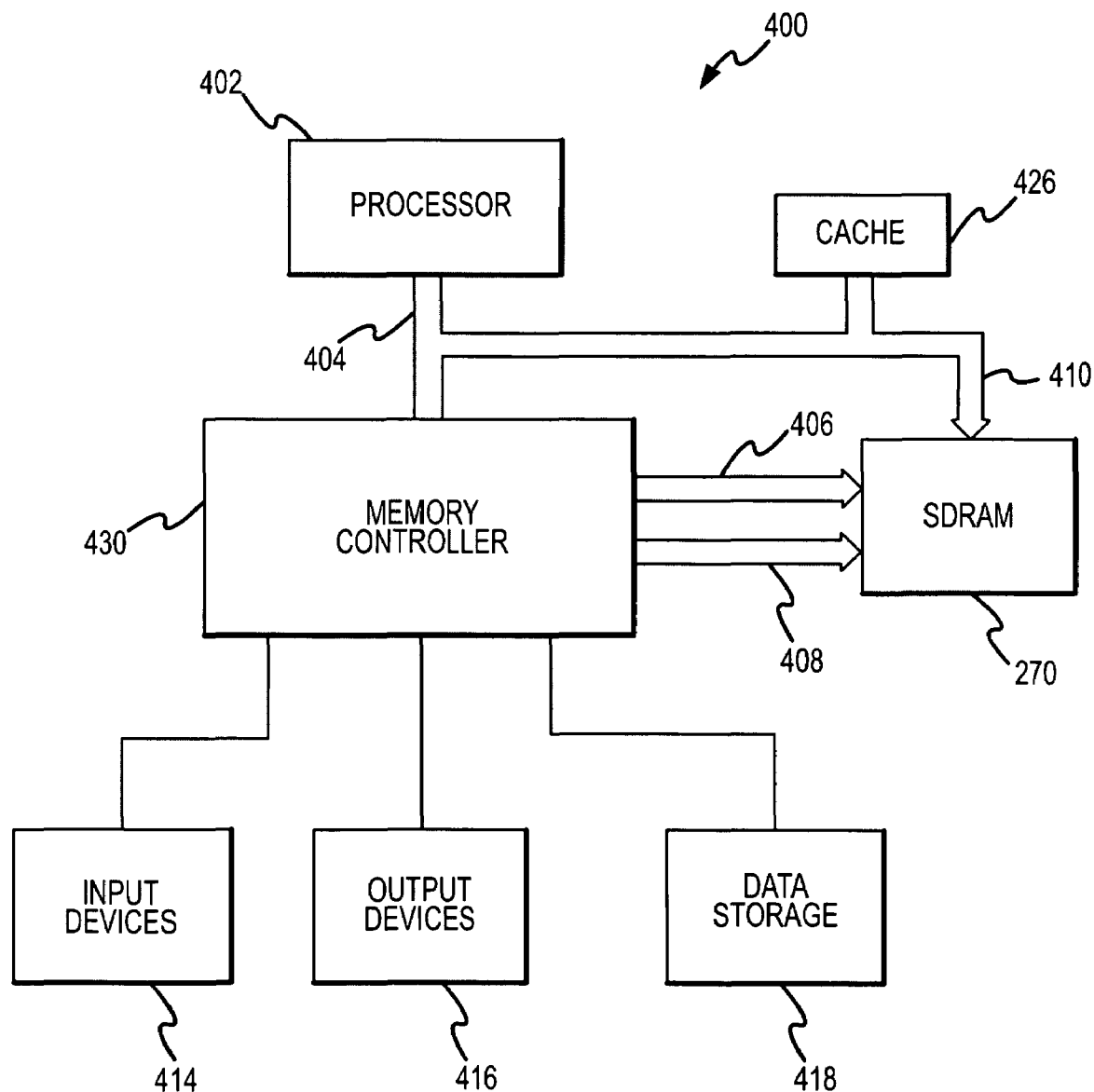
FIG. 5 is a block diagram of a computer system containing the memory device of FIG. 4.

FIG. 5 shows an embodiment of a computer system 400 that may use the SDRAM 270 or some other memory device that contains a timing parameter test system according to one example of the invention. The computer system 400 includes a processor 402 for performing various computing functions, such as executing specific software to perform specific calculations or tasks. The processor 402 includes a processor bus 404 that normally includes an address bus 406, a control bus 408, and a data bus 410. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to store data or retrieve data from external storage media (not shown). Examples of typical storage devices 418 include hard and floppy disks, tape cassettes, and compact disk read-only memories (CD-ROMs). The processor 402 is also typically coupled to a cache memory 426, which is usually static random access memory ("SRAM") and to the SDRAM 270 through a memory controller 430. The memory controller 430 includes an address bus coupled to the address bus 284 (FIG. 4) to couple row addresses and column addresses to the SDRAM 270, as previously explained. The memory controller 430 also includes a control bus that couples command signals to a control bus 276 (FIG. 4) of the SDRAM 270. The external data bus 328 (FIG. 4) of the SDRAM 270 is coupled to the data bus 410 (FIG. 5) of the processor 402, either directly or through the memory controller 430. The memory controller 430 applies appropriate command signals to the SDRAM 270 to cause the SDRAM 270 to operate in the $t_{DQSQ}$ mode described above.

Although the present invention has been described with reference to the disclosed embodiments, persons skilled in the art will recognize that changes may be made in form and detail without departing from the spirit and scope of the invention. For example, although the test system has been described as being used to determine the timing parameter $t_{DQSQ}$ for memory devices, it may also be used to measure other timing parameters with suitable modifications that will be apparent to one skilled in the art. Accordingly, the invention is not limited except as by the appended claims.

We claim:

1. A memory device, comprising:
   a command decoder receiving memory command signals through externally accessible command input terminals, the command decoder generating memory control signals responsive to predetermined combinations of the command signals;
   an address decoder receiving address signals through externally accessible address input terminals, the address decoder generating row and column addressing signals responsive to the address signals;
   a memory array from which data are read and to which data are written at locations corresponding the address signals responsive to the memory control signals;
   a data path extending between a plurality of externally accessible data bus terminals and the memory array, the data path including a data input register through which write data signals are coupled from the data bus terminals to the memory array and a data output register through which read data signals are coupled from the memory array to the data bus terminals, the read data signals being coupled to the data bus terminals and a data strobe signal being coupled to a data strobe terminal responsive to a clock signal being coupled though a clock tree; and
   a built-in test system for determining a timing parameter of the memory device, the test system comprising:
   an oscillator generating a periodic clock signal, the clock signal being applied to the clock tree;
   a test signal generator generating a plurality of test signals, the test signals being coupled to respective ones of the data bus terminals and to the data strobe terminal responsive to respective ones of the clock signals coupled through the clock tree;
   a selector coupled to at least one of the data bus terminals and the data strobe terminal of the memory device, the selector being operable responsive to a control signal to output one of the test signals applied to the respective data bus terminal or the data strobe terminal;
   a selector control device operable to generate the control signal for the selector;
   a multi-phase signal generator coupled to receive the test signal output from the selector, the multi-phase signal generator being operable to output a plurality of multi-phase signals that are delayed from the received test signal by respective delay times that are different from each other; and
   a plurality of phase detectors each of which is coupled to receive a first one of the test signals coupled to the data bus terminals and the data strobe terminal of the memory device and a respective one of the multi-phase signals from the multi-phase signal generators, each of the phase detectors being structured to generate an output signal having a logic level corresponding to the logic level of one of the received signals at a predetermined transition of the other of the received signals.

2. The memory device of claim 1 wherein the memory array comprises a dynamic random access memory array.

3. The memory device of claim 1 wherein the selector control device comprises a shift register.

4. The memory device of claim 1 wherein the multi-phase signal generator comprises:
   a delay circuit receiving the test signal output from the selector and being structured to delay the test signal to produce a delayed signal that is delayed from the test signal by a first delay time; and
   a plurality of phase mixers receiving the test signal from the selector and the delayed signal, the phase mixers being structured to generate the respective multi-phase signals by delaying the test signal by respective percentages of the first delay time.

5. The memory device of claim 1 wherein the test signal generator comprises a counter generating an incrementing pattern of test signals.

6. The memory device of claim 1 wherein the oscillator comprises a ring oscillator.

7. The memory device of claim 1, further comprising:
   a second multi-phase signal generator coupled to receive the first one of the test signals coupled to the data terminals, the second multi-phase signal generator being operable to output a plurality of second multi-phase signals that are delayed from the first one of the test signals by respective second delay times that are different from each other; and a plurality of second phase detectors each of which is coupled to receive the test signal output from the selector and a respective one of the second multi-phase signals from the second multi-phase signal generator, each of the second phase detectors being structured to generate an output signal having a logic level corresponding to the logic level of one of the signals received by the second phase detector at a predetermined transition of the other of the signals received by the second phase detector.

8. The memory device of claim 1, further comprising a plurality of latches coupled to receive respective output signals from the phase detectors, the latches being operable to store the received output signals.

9. A processor-based system, comprising:
an integrated circuit processor having a plurality of externally accessible terminals coupled to a processor bus;
an input device coupled to the processor through the processor bus adapted to allow data to be entered into the computer system;
an output device coupled to the processor through the processor bus adapted to allow data to be output from the computer system; and
a memory device coupled to a processor bus, the memory device comprising:
  a command decoder receiving memory command signals though externally accessible command input terminals, the command decoder generating memory control signals responsive to predetermined combinations of the command signals;
  an address decoder receiving address signals though externally accessible address input terminals, the address decoder generating row and column addressing signals responsive to the address signals;
  a memory array from which data are read and to which data are written at locations corresponding the address signals responsive to the memory control signals;
  a data path extending between a plurality of externally accessible data bus terminals and the memory array, the data path including a data input register though which write data signals are coupled from the data bus terminals to the memory array and a data output register though which read data signals are coupled from the memory array to the data bus terminals, the read data signals being coupled to the data bus terminals and a data strobe signal being coupled to a data strobe terminal responsive to a clock signal being coupled though a clock tree; and
  a built-in test system for determining a timing parameter of the memory device, the test system comprising:
    an oscillator generating a periodic clock signal, the clock signal being applied to the clock tree;
    a test signal generator generating a plurality of test signals, the test signals being coupled to respective ones of the data bus terminals and to the data strobe terminal responsive to respective clock signals from the clock tree;
    a selector coupled to at least one of the data bus terminals and the data strobe terminal of the memory device, the selector being operable responsive to a control signal to output one of the test signals applied the respective data bus terminal or the data strobe terminal;
    a selector control device operable to generate the control signal for the selector;
    a multi-phase signal generator coupled to receive the test signal output from the selector, the multi-phase signal generator being operable to output a plurality of multi-phase signals that are delayed from the received test signal by respective delay times that are different from each other; and
    a plurality of phase detectors each of which is coupled to receive a first one of the test signals coupled to the data bus terminals and the data strobe terminal of the memory device and a respective one of the multi-phase signals from the multi-phase signal generators, each of the phase detectors being structured to generate an output signal having a logic level corresponding to the logic level of one of the received signals at a predetermined transition of the other of the received signals.

10. The processor-based system of claim 9 wherein the memory array comprises a dynamic random access memory array.

11. The processor-based system of claim 9 wherein the selector control device comprises a shift register.

12. The processor-based system of claim 9 wherein the multi-phase signal generator comprises:
a delay circuit receiving the test signal output from the selector and being structured to delay the test signal to produce a delayed signal that is delayed from the test signal by a first delay time; and
a plurality of phase mixers receiving the test signal from the selector and the delayed signal, the phase mixers being structured to generate the respective multi-phase signals by delaying the test signal by respective percentages of the first delay time.

13. The processor-based system of claim 9 wherein the test signal generator comprises a counter generating an incrementing pattern of test signals.

14. The processor-based system of claim 9 wherein the oscillator comprises a ring oscillator.

15. The processor-based system of claim 9, further comprising:
a second multi-phase signal generator coupled to receive the first one of the test signals coupled to the data terminals, the second multi-phase signal generator being operable to output a plurality of second multi-phase signals that are delayed from the first one of the test signals by respective second delay times that are different from each other; and
a plurality of second phase detectors each of which is coupled to receive the test signal output from the selector and a respective one of the second multi-phase signals from the second multi-phase signal generator, each of the second phase detectors being structured to generate an output signal having a logic level corresponding to the logic level of one of the signals received by the second phase detector at a predetermined transition of the other of the signals received by the second phase detector.

16. The processor-based system of claim 9, further comprising a plurality of latches coupled to receive respective output signals from the phase detectors, the latches being operable to store the received output signals.

17. A method of determining a timing parameter in a memory device having a plurality of externally accessible data bus terminals to which read data signals are coupled responsive to a clock signal coupled though a clock tree and an externally accessible data strobe terminal to which a data strobe signal is coupled responsive to a clock signal coupled through the clock tree, the method comprising:

coupling a clock signal through the clock tree;

applying test signals to the data bus terminals and to the data strobe terminal responsive to respective ones of the clock signals coupled through the clock tree;

sequentially selecting each of the test signals applied to a respective one of the data terminals and the data strobe terminal, each of the selected signals being delayed to produce a respective set of delayed signals that are delayed from the selected signal by respective first delay times;

generating a plurality of sets of output signals, the output signals in each set being generated from one of the test signals and the set of the delayed signals produced from the respective selected signal, the output signals in each set having logic levels corresponding to the logic level of the test signal and a respective one of the delayed signals at a predetermined transition of the other of the test signal and a respective one of the delayed signals; and determining the timing parameter based on an examination of the plurality of sets of output signals.

18. The method of claim 17 wherein the memory device comprises an integrated circuit memory device, and wherein the method is performed entirely within the integrated circuit memory device.

19. The method of claim 17 wherein the memory device comprises a dynamic random access memory device.

20. The method of claim 17 wherein the act of applying test signals to the data bus terminals responsive to respective ones of the clock signals coupled through the clock tree comprises sequentially applying different sets of test signals to the data bus terminals responsive to respective ones of the clock signals coupled through the clock tree.

21. The method of claim 20 wherein the act of sequentially applying different sets of test signals to the data bus terminals responsive to respective ones of the clock signals comprises coupling patterns of test signals to the data bus terminals corresponding to incrementing binary number from zero to $2^N$, where N is the number of data bus terminals of the memory device.

* * * * *

UNITED STATES PATENT AND TRADEMARK OFFICE
CERTIFICATE OF CORRECTION

| | | |
|---|---|---|
| PATENT NO. | : 7,362,634 B2 | Page 1 of 1 |
| APPLICATION NO. | : 11/442506 | |
| DATED | : April 22, 2008 | |
| INVENTOR(S) | : Kwak | |

It is certified that error appears in the above-identified patent and that said Letters Patent is hereby corrected as shown below:

In column 8, line 7, in Claim 1, delete "though" and insert -- through --, therefor.

In column 9, line 27, in Claim 9, delete "though" and insert -- through --, therefor.

In column 9, line 31, in Claim 9, delete "though" and insert -- through --, therefor.

In column 9, line 41, in Claim 9, delete "though" and insert -- through --, therefor.

In column 9, line 44, in Claim 9, delete "though" and insert -- through --, therefor.

In column 9, line 49, in Claim 9, delete "though" and insert -- through --, therefor.

In column 10, line 64, in Claim 17, delete "though" and insert -- through --, therefor.

Signed and Sealed this

First Day of July, 2008

JON W. DUDAS
*Director of the United States Patent and Trademark Office*